United States Patent [19]

Globus

[11] Patent Number: 4,592,790
[45] Date of Patent: Jun. 3, 1986

[54] METHOD OF MAKING PARTICULATE URANIUM FOR SHAPED CHARGE LINERS

[76] Inventor: Alfred R. Globus, 26-53 210th St., Bayside, N.Y. 11360

[21] Appl. No.: 236,249

[22] Filed: Feb. 20, 1981

[51] Int. Cl.$^4$ ............................................... C21D 1/00
[52] U.S. Cl. ............................. 148/126.1; 75/0.5 R; 75/245; 75/255; 428/570; 102/306; 241/23; 419/64; 419/66; 427/6; 427/216; 427/217; 427/250
[58] Field of Search ................. 241/23; 102/306–309; 75/255, 0.5 R, 245; 428/570; 419/64, 66; 148/126.1; 427/5, 6, 216, 217, 250, 295

[56] References Cited

U.S. PATENT DOCUMENTS

| | | | |
|---|---|---|---|
| Re. 31,420 | 10/1983 | Christopher | 419/66 |
| 1,429,550 | 9/1922 | Vogt | 241/23 |
| 2,138,672 | 11/1938 | While | 241/23 |
| 2,370,242 | 2/1945 | Hensel et al. | 75/255 |
| 2,370,608 | 2/1945 | Udy | 241/23 |
| 2,853,401 | 9/1958 | Mackiw et al. | 427/217 |
| 2,853,403 | 9/1958 | Mackiw et al. | 427/217 |
| 2,934,482 | 4/1960 | Brooks | 75/245 |
| 3,034,178 | 5/1962 | Cartier et al. | 102/306 |
| 3,077,834 | 2/1963 | Caldwell | 102/306 |
| 3,329,817 | 7/1967 | Walz | 75/245 |
| 3,375,108 | 3/1968 | Wyman, Jr. et al. | 102/306 |
| 3,429,295 | 2/1969 | Shapiro | 427/6 |
| 3,473,740 | 10/1969 | Davis | 241/23 |
| 3,480,425 | 11/1969 | Hardy | 75/0.5 R |
| 3,591,362 | 7/1971 | Benjamin | 75/255 |
| 3,669,634 | 6/1972 | Peters et al. | 75/245 |
| 3,778,295 | 12/1973 | Smith et al. | 427/6 |
| 3,856,581 | 12/1974 | Smeggil et al. | 427/216 |
| 3,948,180 | 4/1976 | Silvia et al. | 102/519 |
| 4,129,443 | 12/1978 | Kaufman | 241/23 |
| 4,441,428 | 4/1984 | Wilson | 102/306 |
| 4,463,678 | 8/1984 | Weimer et al. | 102/307 |

OTHER PUBLICATIONS

Holden, "Physical Metallurgy of Uranium", pp. 213, 242 & 246, Addison-Wesley Publ. Co., Inc. (1958), Reading, Mass.

*Primary Examiner*—Edward A. Miller
*Attorney, Agent, or Firm*—Evelyn M. Sommer

[57] ABSTRACT

A process for the production of depleted uranium metal particles comprising heating depleted uranium metal to red heat, rapidly chilling the heated metal, grinding the resulting brittlized metal to form powder size particles, annealing the particles and coating the particles with silver, copper, or lead, wherein the grinding and annealing are carried out in an inert argon atmosphere. The invention also contemplates the resulting depleted uranium metal powder, compositions containing the same as well as the liners for shaped charges formed therefrom.

3 Claims, No Drawings

METHOD OF MAKING PARTICULATE URANIUM FOR SHAPED CHARGE LINERS

This invention relates to novel liners for shaped charges and to a method of producing liners for shaped charges having novel and improved properties. This invention more particularly relates to a method for the production of an improved depleted uranium metal powder, compositions comprising the same, and liners for shaped charges produced from such compositions; such shaped charges being especially adapted for perforating gas and/or oil formations.

The invention is characterized by the use of specific depleted uranium powder compositions and namely mixtures of such depleted uranium powders, the powder particles having been coated with silver, lead and/or copper, such that the uranium content of the finished liner for the shaped charge amounts to at least 20% by weight of the mixture and preferably at least 40% by weight thereof.

The uranium metal powder prior to being incorporated into the mixture is first coated with metallic silver (or copper or lead) to depress any remaining radio activity, although the quantity of radiation emitted by uranium largely stripped of its $U^{235}$ is quite low. The metal coating also prevents any oxidation of the exposed uranium.

In addition to the depleted uranium, other metals etiher separately or in combination may be added as partial substitutes for the depleted uranium. Thus for example, tungsten may be used in an amount being the reactive equivalent of the quantity of substituted uranium to partially replace the uranium.

The mixture of powders is then compressed and formed into liners for shaped charges. These charges can then be inserted in the form of pressed cones into explosive shells. Utilizing such explosives enables the user to attain perforations of at least fifteen (15) inches into solid rock as compared with a possible six (6) inches for copper powder used under the same conditions.

The crux of the invention lies in the novel depleted uranium powder and the method for its production.

The powder is produced by subjecting solid depleted uranium metal to thermal shock. This is accomplished by heating the solid uranium metal to red heat in an atmosphere of argon, including some hydrogen, and then rapidly chilling the heated metal to a temperature below 0° F. This chilling is required to be accomplished in under sixty (60) seconds. The heating of the metal pieces to red heat followed by consecutive rapid chilling results in the brittlizing of the metal, i.e., achievement of certain mechanical properties in the metal.

The thusly formed brittlized metal is then ground up in a ball mill, using steel grinding balls, with precautions being taken to insure that the grinding does not result in the formation of excessive heat as in this stage, too much heating up of the metal is not desirable.

On the removal of the ground up metal, the metal now in fine particulate (powder) form is annealed by heating the metal powder to red heat and cooling under an argon gas atmosphere. The powder thereby obtained is depleted uranium powder to be further processed for use in forming the shaped charge liner.

After annealing, but prior to removal of the powder from the inert argon gas atmosphere, the inert gas is drawn off so as to provide a high vacuum atmosphere. Under maintenance of this high vacuum, silver or its equivalent, i.e. copper or lead, is vapor deposited onto the particles of depleted uranium metal. This is carried out while the uranium powder is maintained in an agitated state, as for instance, by slow tumbling and ensures the uniform, even deposition of the metal (silver) coating on the individual uranium particles. This has the effect of rendering the uranium powder inert to the atmosphere and facilitates its further processing by the conventional metal powder treatment techniques. The danger of oxidation of the uranium metal by exposure to the atmosphere is avoided as is any possibility of the generation and release of low level radiation.

The thusly obtained uranium powder (with silver or other metal coating) is possibly following admixture with copper and/or lead powders pressed to form a liner. The pressing is carried out under conditions whereby there results a liner consisting of small uranium particles embedded within and bonded together by the soft metal.

An example of the above method is given in the following:

Pieces of depleted uranium metal having a weight of 100 grams are heated to red heat over a period of time (four (4) to six (6) hours) in an atmosphere of argon and hydrogen, after which they are removed from the furnace and rapidly cooled down to less than ambient temperature (0° F.) in an inert atmosphere of still argon; there is thusly obtained a total brittlization of the metal structure.

Following the aforesaid complete cooling, there is carried out a grinding of the now brittle metal pieces in a ball mill provided with steel grinding balls. The grinding takes place over a period of eight to ten (8 to 10) hours, precautions being observed so that no excessive increase in the temperature of the uranium metal takes place to provide a uranium powder i.e., depleted uranium powder material. The fine powder particles having a particle size of $-100$ to $-325$ mesh are removed from the mill and are then subjected to annealing i.e. heating in a furnace to red heat in an inert atomosphere, followed by cooling.

An uranium powder is obtained characterized by the following properties: the uranium powder yields only low level radiation, is very sensitive to oxidation and readily supports combustion.

The invention further relates to such uranium powder wherein the powder particles have deposited on their surfaces a coating of silver or its equivalent metal, for example copper or lead, the deposition taking place with the particles maintained in an agitated state, under high vacuum and with the silver or its equivalent being supplied in vapor form.

The particles with silver or other metal coating may be thereafter combined with copper and/or lead in fine powder form. The following two (2) compositions illustrate this embodiment of the invention:

1.

Depleted Uranium Powder (coated with silver Ag—% by weight): 45 wt.%
Copper: 35 wt.%
Lead: 20 wt.%

2.

Depleted Uranium Powder (silver coating, Ag—%by weight): 50 wt.%
Copper: 30 wt.%

Lead: 20 wt.%

The above powders were introduced into a mold corresponding to the shape of the desired liner and a pressure of ten to forty (10–40) tons psig and preferably thirty to forty (30–40) tons psig applied thereto for several hours. The shaped liners thus produced were then inserted in the conventional manner into the explosive shell.

When the resultant explosives were used, a perforation of fifteen (15) inches into a solid rock was obtained in each instance.

While the invention has been described as including the use of the depleted uranium powders in the manufacture of liners for shaped charges, it is to be understood that the claimed powders, as well as compositions containing the same can be used in the manufacture of high density, high load bearing articles and parts of such articles including supports, bearings, heavy weight and high friction exposed surfaces and parts, protective armor-like surfaces, surfaces resistant to penetration and attack and the like.

I claim:

1. A process for the production of metal coated depleted uranium particles comprising heating depleted uranium metal to red heat, rapidly chilling the heated metal to 0° F., grinding the resulting brittlized metal to form depleted uranium metal particles having a particle size of at most −100 mesh, annealing the particles, wherein the grinding and annealing are carried out in an inert argon atmosphere, after said annealing, removing the inert argon gas under conditions to provide a high vacuum stage and then vapor depositing one of silver, copper or lead metal onto said particles so as to form a uniform coating of said metal on said particles.

2. Process according to claim 1 wherein said chilling takes place in less than sixty (60) seconds.

3. Process according to claim 1 wherein the metal which is vapor deposited on said uranium particles is silver.

* * * * *